United States Patent
Brouillette et al.

(10) Patent No.: US 6,566,612 B2
(45) Date of Patent: May 20, 2003

(54) METHOD FOR DIRECT CHIP ATTACH BY SOLDER BUMPS AND AN UNDERFILL LAYER

(75) Inventors: Guy P. Brouillette, Canton Shefford (CA); David H. Danovitch, Granby (CA); Peter A. Gruber, Michigan Lake, NY (US); Michael Liehr, Essex Junction (DE); Carlos J. Sambucetti, Croton Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/055,294

(22) Filed: Jan. 22, 2002

(65) Prior Publication Data

US 2002/0062556 A1 May 30, 2002

Related U.S. Application Data

(62) Division of application No. 09/301,890, filed on Apr. 29, 1999, now Pat. No. 6,341,418.

(51) Int. Cl.[7] .................................................. H01R 9/09
(52) U.S. Cl. ........................ 174/263; 174/261; 174/262; 257/780; 361/767; 438/108
(58) Field of Search ................................. 174/263, 262, 174/261, 260; 29/841; 257/778, 780, 781, 783; 438/108; 361/767, 771

(56) References Cited

U.S. PATENT DOCUMENTS

| | | | |
|---|---|---|---|
| 5,729,896 A | * | 3/1998 | Dalal et al. ................. 174/260 |
| 5,925,934 A | | 7/1999 | Lim |
| 5,990,545 A | | 11/1999 | Schueller et al. |
| 6,002,180 A | * | 12/1999 | Akram et al. ................ 257/783 |
| 6,020,220 A | | 2/2000 | Gilleo et al. |
| 6,074,895 A | | 6/2000 | Dery et al. |
| 6,075,290 A | | 6/2000 | Schaefer et al. |
| 6,121,689 A | | 9/2000 | Capote et al. |
| 6,138,348 A | | 10/2000 | Kulesza et al. |
| 6,165,885 A | | 12/2000 | Gaynes et al. |
| 6,181,569 B1 | | 1/2001 | Chakravorty |
| 6,190,940 B1 | | 2/2001 | DeFelice et al. |
| 6,204,089 B1 | * | 3/2001 | Wang ......................... 438/108 |
| 6,204,095 B1 | | 3/2001 | Farnworth |
| 6,207,475 B1 | | 3/2001 | Lin et al. |
| 6,207,548 B1 | | 3/2001 | Akram et al. |
| 6,211,052 B1 | | 4/2001 | Farnworth |
| 6,326,698 B1 | * | 12/2001 | Akram ........................ 257/781 |

* cited by examiner

Primary Examiner—Albert W. Paladini
(74) Attorney, Agent, or Firm—Robert M. Trepp; Randy W. Tung

(57) ABSTRACT

A method for direct chip attach of a semiconductor chip to a circuit board by using solder bumps and an underfill layer is disclosed. In the method, a layer of in-situ polymeric mold material is first screen printed on the top surface of the semiconductor chip exposing a multiplicity of bond pads. The in-situ polymeric mold layer is formed with a multiplicity of apertures which are then filled with solder material in a molten solder screening process to form solder bumps. A thin flux-containing underfill material layer is then placed on top of a circuit board over a plurality of conductive pads which are arranged in a mirror image to the bond pads on the semiconductor chip. The semiconductor chip and the circuit board are then pressed together with the underfill layer inbetween and heated to a reflow temperature of higher than the melting temperature of the solder material until electrical communication is established between the bond pads and the conductive pads. In the bonded assembly, the in-situ polymeric mold layer and the underfill material layer forms a composite underfill to replace a conventional underfill material that must be injected between bonded chip and substrate by a capillary action in a time consuming process.

8 Claims, 3 Drawing Sheets

METHOD FOR DIRECT CHIP ATTACH BY SOLDER BUMPS AND AN UNDERFILL LAYER

This is a divisional of copending application(s) Ser. No. 09/301,890 filed on Apr. 29, 1999 U.S. Pat. No. 6,341,418.

FIELD OF THE INVENTION

The present invention generally relates to a method for bonding a semiconductor chip to a circuit board and more particularly, relates to a method for direct chip attach of a semiconductor chip to a circuit board by solder bumps on the chip, conductive pads on the circuit board and a flux-containing underfill layer thereinbetween.

BACKGROUND OF THE INVENTION

In modern semiconductor devices, the ever increasing device density and decreasing device dimensions demand more stringent requirements in the packaging or interconnecting techniques of such devices. Conventionally, a flip-chip attachment method has been used in the packaging of IC chips. In the flip-chip attachment method, instead of attaching an IC die to a lead frame in a package, an array of solder balls is formed on the surface of the die. The formation of the solder balls is normally carried out by an evaporation method of lead and tin through a mask for producing the desired solder balls. More recently, the technique of electro-deposition has been used to produce solder balls in flip-chip packaging.

Other solder ball formation techniques that are capable of solder-bumping a variety of substrates have been proposed. These techniques work well in bumping semiconductor substrates that contain solder structures over a minimum size. One of the more popularly used techniques is a solder paste screening technique which can be used to cover the entire area of an eight inch wafer. However, with the recent trend in the miniaturization of device dimensions and the reduction in bump-to-bump spacing (or pitch), the solder paste screening technique becomes impractical. For instance, one of the problems in applying solder paste screening technique to modern IC devices is the paste composition itself. A paste is generally composed of a flux and solder alloy particles. The consistency and uniformity of the solder paste composition become more difficult to control with a decreasing solder bump volume. A possible solution for this problem is the utilization of solder pastes that contain extremely small and uniform solder particles. However, this can only be achieved at a high cost penalty. Another problem in using the solder paste screening technique in modern high density devices is the reduced pitch between bumps. Since there is a large reduction in volume from a screened paste to the resulting solder bump, the screen holes must be significantly larger in diameter than the final bumps. The stringent dimensional control of the bumps makes the solder paste screening technique impractical for applications in high density devices.

A more recently developed injection molded solder (IMS) technique attempted to solve these problems by dispensing molten solder instead of solder paste. However, problems have been observed when the technique is implemented to wafer-sized substrates. U.S. Pat. No. 5,244,143, discloses the injection molded solder technique and is hereby incorporated by reference in its entirety. One of the advantages of the IMS technique is that there is very little volume change between the molten solder and the resulting solder bump. The IMS technique utilizes a two-inch wide head that fills borosilicate glass molds that are wide enough to cover most single chip modules. A narrow wiper provided behind the solder slot passes the filled holes once to remove excess solder. The IMS method for solder bonding is then carried out by applying a molten solder to a substrate in a transfer process. When smaller substrates, i.e., chip scale or single chip modules (SCM's) are encountered, the transfer step is readily accomplished since the solder-filled mold and substrate are relatively small in area and thus can be easily aligned and joined in a number of configurations. For instance, the process of split-optic alignment is frequently used in joining chips to substrates. The same process may also be used to join a chip-scale IMS mold to a substrate (chip) which will be bumped.

A more recently developed method that alleviated the limitations of the solder paste screening technique of significant volume reductions between the initial paste and the final solder volume is the molten solder screening (MSS) method. In the MSS method, pure molten solder is dispensed. When the MSS solder-bumping method is used on large substrates such as eight inch or twelve inch wafers, surface tension alone is insufficient to maintain intimate contact between a mold and a substrate. In order to facilitate the required abutting contact over large surface areas, a new method and apparatus for maintaining such are necessary.

For instance, in a copending application of Attorney Docket No. Y0997-216 commonly assigned to the Assignee of the present application and is hereby incorporated by reference in its entirety, a method for forming solder bumps by a MSS technique that does not have the drawbacks or shortcomings of the conventional solder bumping techniques has been proposed. In the method, a flexible die member is used in combination with a pressure means to enable the die member to intimately engage a mold surface and thus filling the mold cavities and forming the solder bumps. The flexible die head also serves the function of a wiper by using a trailing edge for removing excess molten solder from the surface of the mold.

The MSS process can be carried out by first filling a multiplicity of cavities in the surface of a mold with molten solder. This is accomplished by first providing a stream of molten solder and then passing a multiplicity of cavities in the mold surface in contact with the surface of the stream while adjusting a contact force such that the molten solder exerts a pressure against the surface of the mold to fill the cavities with solder and to remove excess solder from the surface of the mold. The stream of molten solder is supplied through a die head constructed of a flexible metal sheet that is capable of flexing at least 0.0015 inches per inch of the die length. The solder has a composition between about 58% tin/42% lead and about 68% tin/32% lead. The multiplicity of cavities each has a depth-to-width aspect ratio of between about 1:1 and about 1:10. The mold body is made of a material that has a coefficient of thermal expansion substantially similar to that of silicon or the final solder receiving material. The contact between the multiplicity of cavities and the surface of the molten solder stream can be adjusted by a pressure means exerted on the flexible die.

The MSS method is therefore a new technique for solder bumping large eight inch or even twelve inch silicon wafers. As previously described, the technique involves filling cavities in wafer-sized mold plates with molten solder, solidifying the solder and then transferring the solder in these cavities to the wafer. The transfer process requires aligning the cavities in a mold plate to the solder receiving pads on a silicon wafer and then heating the assembly to a solder reflow temperature. This results in the molten solder metallurgically bonding to the metallized pads on the wafer and thus assuring the solder in each cavity to transfer from the mold plate to the wafer. Since various solder alloys are readily processed with the MSS technique, the mold plate and wafer assembly must remain aligned throughout the reflow process. Since the contact area between mold plate and wafer covers an entire eight inch or twelve inch silicon wafer, it is important that these materials match very closely in coefficient of thermal expansion (CTE), i.e., the mold plate may be fabricated of a borosilicate glass.

In another copending application assigned to the common assignee of the present invention, Attorney Docket No. Y0997-273, a process for etching a glass mold plate is disclosed for producing the desired cavities in a mold for receiving molten solder. However, since glass is an amorphous material, processing parameters which control isotropic etching must be carefully monitored to produce the desired cavity volumes. Even when such control is possible, the resulting cavity is hemispherical in shape which allows the reflowed solder ball certain degree of lateral movement before bonding to the solder receiving pad on a wafer or any other electronic substrates. It is desirable to eliminate any possibility of such lateral movement so that highest accuracy of ball location during the reflow process can be maintained.

In still another copending application assigned to the common assignee of the present invention, Attorney Docket No. Y0998-216, hybrid molds for molding a multiplicity of solder balls which are constructed by a crystalline silicon face plate provided with a multiplicity of cavities formed in a front surface and a rigid backing plate which has substantially the same coefficient of thermal expansion as crystalline silicon for bonding to a back surface of the face plate and a method for preparing such molds are disclosed. In the construction of the hybrid molds, a complicated procedure is used to securely bond a silicon face plate to a rigid backing plate by injecting an adhesive into a gap formed between the two plates. The method is costly and time consuming.

In a conventional flip chip process, an underfill material that is CTE matched to solder by using fillers in the underfill composition is frequently dispensed after chip-substrate attach by a capillary action through the gap between the chip and the substrate. The distance between the chip and the substrate is typically between 75~125 $\mu$m. The conventional underfill dispensing process is a time consuming process which affects the yield of the fabrication process. Attempts have been made to reduce the fill time for the underfill material by the dispensing a flux-containing underfill on the substrate's chip site prior to a chip-substrate attach process. However, in order to permit fluxing action of the chip's solder bumps to the substrate pads through the entire thickness of the underfill, i.e., 75~125 $\mu$m, the amount of filler material that can be added into the underfill composition is limited. As a consequence, the CTE of the underfill composition cannot be lowered to a desirable level, i.e., 20~25 ppm/° C. or a level that is close to that of solder. The process therefore presents limited reliability enhancement and is inadequate for many chip-on-laminate applications.

In still another copending application assigned to the common assignee of the present invention and filed on the same date of the present invention, Attorney Docket No. Y0998-197 which is incorporated hereby in its entirety by reference, a method for forming solder bumps directly on a wafer surface by utilizing a screen printable polymeric layer as a solder mold and then plating a solder material into the cavities overlying conductive pads is disclosed. A mechanical fixture for bumping direct-on-wafer solder bumps by a molten solder screening technique is also disclosed. The method allows a wafer to be solder bumped with an in-situ mold by the molten solder screening technique and therefore eliminates the need for a separate mold. The solder fills the in-situ mold holes to the same level as the top surface of the mold layer, i.e., about 2~3 mils above the surface of the silicon wafer. After the solder solidifies, the wafer is ready to be diced into chips. Since the solder is contained within the mold cavities, it is much more resistant to damage than solder balls that normally protrude above the surface. After the initial solder deposition, there is only one reflow process required to transfer the chips to the laminate substrate.

Still others have suggested a method of first applying a B-stage epoxy film on the chip surface which has the same thickness as the solder bumps, i.e., 75~125 $\mu$m. The epoxy film, placed on the chip after the solder bumps, has some of the same processing difficulties as the approach of using flux-containing underfill materials on the substrate's chip site. Furthermore, a temporary chip attach for burn-in could not be effected without fully curing the epoxy film and thus making any subsequent removal process difficult, if not impossible.

It is therefore an object of the present invention to provide a method for bonding a semiconductor chip to a circuit board that does not have the drawbacks or shortcomings of the conventional methods.

It is another object of the present invention to provide a method for bonding a semiconductor chip to a circuit board by utilizing solder bumps planted on the surface of the chip and an underfill layer disposed on the surface of the circuit board.

It is a further object of the present invention to provide a method for bonding a semiconductor chip to a circuit board by forming bonds between a first multiplicity of solder bumps on the chip and a second multiplicity of conductive pads on the circuit board by an underfill layer disposed thereinbetween.

It is another further object of the present invention to provide a method for bonding a semiconductor chip to a circuit board by first providing a polymeric based in-situ solder mold, with CTE properties within the range of that of the semiconductor chip and that of the solder, on the top surface of the chip and then filling the mold with a solder material for forming solder bumps that are used for bonding to conductive pads on a circuit board.

It is still another object of the present invention to provide a method for direct chip attach by solder bumps and an underfill layer wherein a flux-containing underfill material is utilized for bonding between the semiconductor chip and the circuit board.

It is yet another object of the present invention to provide a method for direct chip attach by solder bumps and an underfill layer in which a thin layer of flux-containing underfill material of less than 5 $\mu$m thickness is used between a chip and a circuit board.

It is still another further object of the present invention to provide an electronic assembly that includes a semiconductor chip that has a top surface overlied by a polymeric in-situ mold of appropriate mechanical properties for solder fatigue enhancement (3~30 ppm/° C.) containing a multiplicity of solder bumps therein and a circuit board which has a top surface formed with a multiplicity of conductive pads bonded together by a flux-containing underfill layer inbetween.

It is yet another further object of the present invention to provide an electronic assembly which incorporates composite underfill layer consisting of a polymeric in-situ mold layer and a flux-containing underfill material layer.

SUMMARY OF THE INVENTION

In accordance with the present invention, a method for bonding a semiconductor chip to a circuit board by a direct chip attach technique utilizing solder bumps and an underfill layer is provided.

In a preferred embodiment, a method for bonding a semiconductor chip to a circuit board by solder bumps and an underfill layer can be carried out by the steps of first providing a semiconductor chip that has a top surface formed with a first multiplicity of conductive pads, coating a layer of insulating material having a first multiplicity of apertures on the top surface of the semiconductor chip exposing the first multiplicity of conductive pads, the layer of insulating material has a thickness substantially similar to a thickness of the solder bumps to be planted and CTE between 3~30 ppm/° C., depositing a ball-limiting-metallurgy layer in the first multiplicity of apertures overlying the first multiplicity of conductive pads, filling the first multiplicity of apertures with a solder material forming a first multiplicity of solder bumps, providing a circuit board which has a second multiplicity of conductive pads formed in a top surface positioned in mirror image to the first multiplicity of conductive pads on the semiconductor chip, disposing a layer of a flux-containing underfill material on the top surface of the circuit board, and engaging the top surface of the circuit board and the top surface of the semiconductor chip together with the first multiplicity of conductive pads intimately contacting the second multiplicity of conductive pads through the layer of underfill material, and heating to a temperature sufficient to establish electrical communication between the first multiplicity and the second multiplicity of conductive pads.

In the method for bonding a semiconductor chip to a circuit board by solder bumps and an underfill layer, the step of providing a semiconductor chip may further include a step of providing a silicon wafer which has a plurality of semiconductor chips formed on a top surface. The layer of insulating material coated on the top surface of the semiconductor chip is an in-situ mold for molding a first multiplicity of solder bumps in the first multiplicity of apertures. The layer of insulating material may be a polymeric material that can be patterned in a photolithographic process, or a polyimide material that is photo-sensitive or processable by laser ablation. The layer of insulating material has a CTE of 3~30 ppm/° C.

In the method for bonding a semiconductor chip to a circuit board, the BLM layer may include at least two sub-layers selected from the group consisting of an adhesion layer, a diffusion barrier layer and a wetting layer. The BLM layer may be deposited by a physical vapor deposition technique (including but not limited to evaporation or sputtering), an electroless or electrolytic plating technique. The step of depositing the BLM layer may further include steps of masking and/or removing by etching away the BLM layer that is not situated in the first multiplicity of apertures. The step of filling the first multiplicity of apertures with a solder material may be carried out by an electrodeposition, an electroless deposition technique or MSS technique. The method may further include the step of coating the second multiplicity of conductive pads with a BLM layer prior to the positioning step for the layer of the fluxed underfill material.

In the method for bonding a semiconductor chip to a circuit board by a direct chip attachment technique, the layer of underfill material is disposed on the top surface of the circuit board to a thickness of not more than 15 μm, or to a thickness between about 5 μm and about 15 μm. The layer of insulating material on the wafer may have a thickness of not less than 20 μm, or a thickness between about 20 μm and about 200 μm. The layer of insulating material on the wafer may further have a CTE between 3~30 ppm/° C. The layer of underfill material may further include a surface-enhancing agent, or a surface wetting agent. The step of heating the semiconductor chip and the circuit board to a temperature sufficient to establish electrical communication does not cause the formation of solder balls from the first multiplicity of solder bumps.

The present invention is further directed to an electronic assembly which includes a semiconductor chip that has a top surface overlayed by a layer of insulating material and containing a first multiplicity of via openings each filled with a solder bump on top of a bond pad, and a circuit board which has a top surface formed with a second multiplicity of conductive pads positioned in a mirror image relationship with the first multiplicity of via openings on the semiconductor chip, the top surface of the circuit board intimately joins the top surface of the semiconductor chip with an underfill layer disposed thereinbetween such that electrical communication between the first multiplicity of via openings filled with the solder bumps and the corresponding second multiplicity of conductive pads is established.

In the electronic assembly, the layer of insulating material overlying the top surface of the semiconductor chip is formed of a photo-sensitive polymeric material. The layer of insulating material overlying the top surface of the semiconductor chip is formed of a material that is patterned by a photolithographic process. The layer of insulating material overlying the top surface of the semiconductor chip is an in-situ mold for the first multiplicity of solder bumps. The layer of insulating material on the wafer may have a thickness of between about 20 μm and about 200 μm. The layer of insulating material on the wafer may further have a CTE between 3~30 ppm/° C. Each of the multiplicity of via openings may further include a BLM layer disposed between the solder bump and the bond pad. The BLM layer may include at least two sublayers selected from the group consisting of an adhesion layer, a diffusion barrier layer and a wetting layer. The underfill layer may further include a surface enhancing agent or a wetting agent. The underfill layer disposed between the semiconductor chip and the circuit board may have a thickness of not more than 15 μm.

In an alternate embodiment, a method for direct chip attach (DCA) by solder bumps and underfill layer can be carried out by the operating steps of first providing a semiconductor chip equipped with a first multiplicity of bond pads on a top surface, then coating the top surface with a photo-sensitive polymeric material layer, patterning the photo-sensitive polymeric material layer by a photolithographic method to form a first multiplicity of via openings exposing the first multiplicity of bond pads, filling the first multiplicity of via openings with a solder material forming solder bumps, providing a circuit board equipped with a second multiplicity of conductive pads on top, the second multiplicity of conductive pads is formed in a mirror image to the first multiplicity of bond pads on the semiconductor chip, disposing a flux-containing underfill layer on top of the circuit board, and bonding under heat the first multiplicity of bond pads to the second multiplicity of conductive pads to establish electrical communication with the flux-containing underfill layer thereinbetween.

The method for direct chip attach by solder bumps and underfill layer may further include the step of bonding the first multiplicity of bond pads to the second multiplicity of conductive pads at a temperature higher than a melting point of the solder material. The photo-sensitive polymeric material layer maybe formed of polyimide. The photo-sensitive polymeric material layer may have a thickness of between about 20 μm and about 200 μm. The flux-containing underfill layer may have a thickness not more than 15 μm.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

Figure 1:
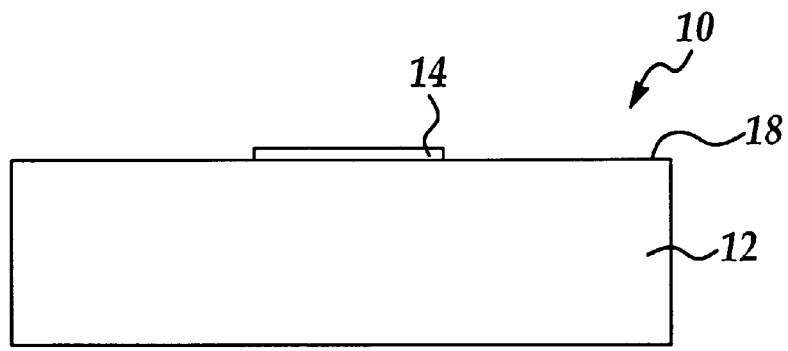
FIG. 1 is an enlarged, cross-sectional view of a present invention semiconductor chip that has a bond pad formed on top.

The present invention discloses a method for direct chip attach by using solder bumps and an underfill layer inbetween a semiconductor chip and a circuit board such that an assembled device does not have to be filled with an underfill material afterwards. Before the direct chip attach process is carried out, a thin underfill layer is first pre-disposed over a pad array site on a laminate substrate. The underfill layer contains a fluxing agent and has a thickness of less than 5 μm, i.e., substantially thinner than that typically used. The present invention novel use of a pre-disposed thin underfill layer therefore eliminates the need for underfill dispensing after chip-join along with its inherent processing difficulties such as slowed production due to time-consuming capillary feed around the periphery of the attached chip and underfill voids that are difficult to detect. The voids can in turn lead to increased failure rates due to stresses on the affected solder joints.

In the present invention novel method, once the underfill is applied to the circuit board, or the substrate, the chip is aligned and placed onto the underfill layer. The chip/circuit board assembly is then heated to at least a solder reflow temperature, typically about 200° C. or slightly above the 183° C. eutectic solder melting temperature. When the reflow temperature in the assembly is reached, the fluxing agent in the underfill activates the solder in the mold and thereby pulls it toward the metalized conductive pads on the circuit board (or the substrate). Since the conductive pads have large wetting diameters, there is essentially no ball-up of the solder material. During the reflow process, the solder only protrudes enough to penetrate through the thin underfill layer to wet the conductive pads on the circuit board. Most of the solder material stays within the in-situ mold which in effect becomes the bulk of the underfill.

A present invention composite underfill can be produced in the following manner. When the reflow temperature is approached, the thin underfill layer is activated to adhesively bond to the in-situ mold layer on the chip. Through this bonding, the underfill and the mold layer become one integral part. Since the solder stays within the mold layer, i.e., stays within the via openings in the mold layer, and there is essentially no ball-up phenomenon, the solder mold functions as the main stress absorber between the CTE of silicon and the plastic laminate. To achieve this functionality along with being an in-situ mold, the CTE of the mold layer on top of the silicon is between that of solder and silicon. Since the bulk of the solder material is within the mold layer even after direct chip attach, the mold layer becomes the major component of the composite underfill, while the pre-disposed thin layer applied to the circuit board before attach becomes the minor component, as far as thickness is concerned.

The present invention novel method therefore effectively eliminates the need for a separate solder mold, the need for underfill dispensing process after chip join, and voiding problems which are frequently encountered in peripherally applied underfill. The present invention method combines an in-situ solder mold with a thin pre-disposed fluxing underfill into a composite underfill layer. The major function of the underfill is actually performed by the in-situ mold layer on the chip as a main stress absorber.

Figure 2:
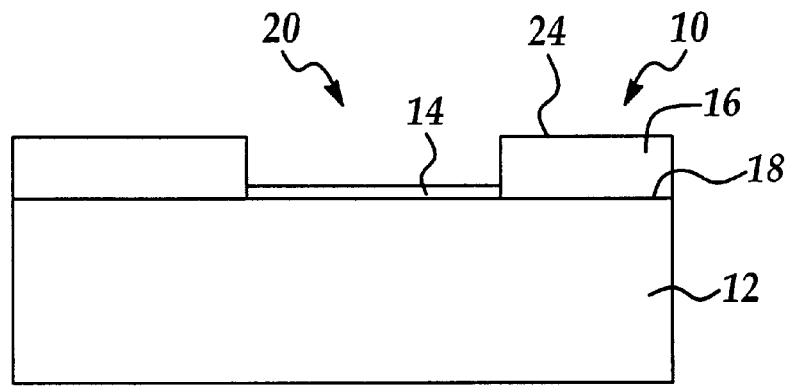
FIG. 2 is an enlarged, cross-sectional view of the present invention semiconductor chip of FIG. 1 having an in-situ polymeric mold formed on top exposing the bond pad.

Referring initially to FIG. 1, wherein an enlarged, cross-sectional view of a present invention semiconductor chip 10 is shown. The semiconductor chip 10 consists of a bond pad 14, most likely formed of aluminum on a silicon substrate 12. A screen printable polymeric material 16 such as polyimide is then printed on a top surface 18 of the silicon substrate 12. This is shown in FIG. 2. The present invention method simplifies a molten solder screening (MSS) process by utilizing a screen printable polymeric layer as a solder mold and thus, eliminating the need for a solder mold or for a solder transfer step. The photo processing step of a photo-sensitive wafer passivation layer for producing openings for the solder bumps is also eliminated. The screen printable polymeric material, such as a polyimide is used as a passivation layer that has a coefficient of thermal expansion (CTE) similar to that for a silicon wafer. Suitable screen printable polyimide materials may be obtained commercially from the epoxy technology company of Billerica, Mass. under the product names of EPO-TEK® 600 or 688-PFC. The screen printable polyimide can be used to define solder bumps of any size except those of the smallest dimensions, i.e., smaller than 0.003 inch. The method further eliminates the spin coating process, the patterning process and the ablation process normally required in processing polyimides. The screen printable polyimide films can be deposited in either a single or multiple layers to a thickness of 0.003 inch or more. The printed polyimide film therefore defines a mask for the deposition of both the ball limiting metallurgy layer and the solder bump.

The screen printable polyimide material used in the present invention novel method is a single component, high temperature, low CTE composition that is specifically formulated for printing on a silicon wafer while leaving a multiplicity of conductive pads exposed. The screen printable polyimide material has excellent definition and printability. Once the material is cured, it prevents smearing during a backside lapping process. The low residual stress in the film after curing further prevents the bowing problem of silicon wafer due to high stresses. In screen printing a polyimide film, a polyimide material that is highly filled with a low CTE filler is used. The highly filled content of the polyimide material leads to a low shrinkage, low residual stress film layer and thus a flat wafer. Moreover, the screen printing process requires less polyimide material per wafer and the material itself is substantially lower in cost than typical photo-sensitive polyimides. A typical highly filled screen printable polyimide such as EPO-TEK® 600 contains approximately 73% solids. The choice of the print screen should be carefully made such that the screen emulsion material selected is not susceptible to the solvents used in the polyimide paste. The screen printing process can be carried out by an equipment that has precision optics and other capabilities necessary to align and print on wafers with micrometer accuracy and superior repeatability. The squeegee used in the printing process should be made of materials that are not vulnerable to attacks by the solvents in the polyimide paste and furthermore, should be able to produce sharp print patterns. The squeegee shape, material and pressure should be selected based on the thickness required and the viscosity of polyimide. A polyimide film can be printed on the wafer with a single pass of the squeegee across the screen so that the entire wafer is covered, leaving open only the sites of the conductive pads.

Figure 3:
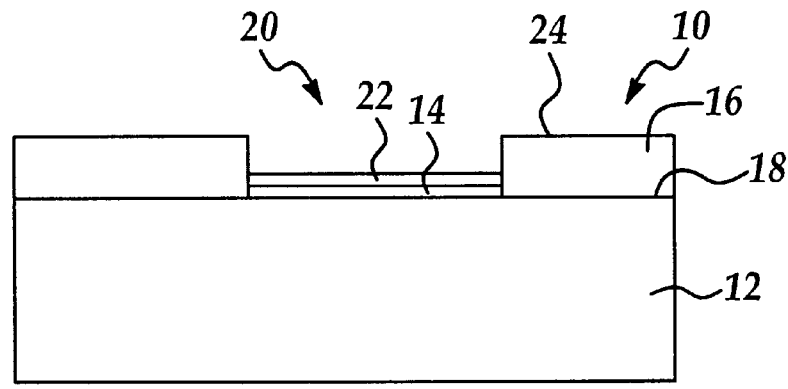
FIG. 3 is an enlarged, cross-sectional view of the present invention semiconductor chip of FIG. 2 having a BLM layer deposited on top of the bond pad.

As shown in FIG. 2, after the screen printable polyimide 16 is printed on the top surface 18 of the silicon substrate 12, the polyimide film can be cured by such means as infrared radiation for a time period between about 10 and about 20 minutes. Once the printing and the curing of the polyimide layer is completed, an electroless plating of a BLM layer 22 such as Ni—Au over the aluminum bond pad 14 can be carried out as in FIG. 3. The thickness of the BLM layer 22 is relatively small such that it only takes up a small fraction of the total polyimide thickness. Once the BLM layer 22 is deposited over the aluminum bond pad 14 in the aperture 20 formed by the screen printing process, the wafer is ready for receiving molten solder. This is shown in FIG. 3. The molten solder can be deposited directly onto the wafer surface without using a transfer mold.

As shown in FIG. 3, the aperture 20 in the screen printable polyimide layer 16 above the BLM layer 22 has a small aspect ratio, i.e., a depth to diameter ratio of ½ or less. For example, when the depth of the aperture 20 above the BLM layer 22 is between 0.002~0.003 in, or approximately the thickness of the polyimide film, the diameter of the aperture 20 is between about 0.005~0.007 in.

Figure 4:
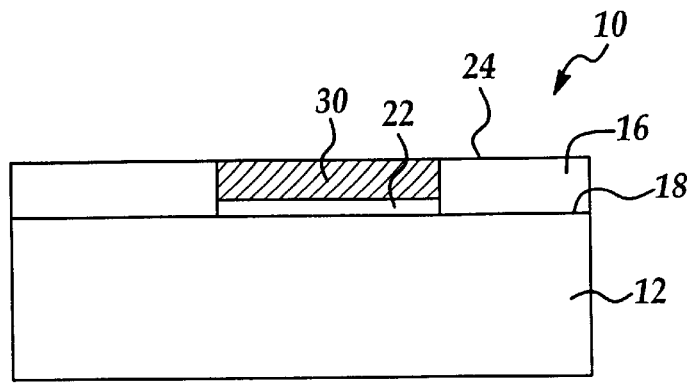
FIG. 4 is an enlarged, cross-sectional view of the present invention semiconductor chip of FIG. 3 having a solder material filled in the via opening overlying the BLM layer and the bond pad.

As shown in FIG. 4, once the shallow via opening 20 is filled with a solder material 30 by using a molten solder screening process, the solder 30 solidifies into a flat pancake of solder forming a flattened solder bump. A further advantage made possible by the present invention method of solder deposition is the ease of wafer testing at this intermediate stage of the bonding process. The flat pancake of solder has a much larger planar area for contact by probe needles. Another feature of the flattened solder bumps is the mechanical robustness. Since the solder remains coplanar with the rest of the wafer surface, there is nothing protruding that could be damaged by handling during this intermediate process step. It should be noticed that in FIG. 4, only the BLM layer 22 is shown under the solder bump 30, the bond pad 14 is not shown for simplicity reason.

Figure 5:
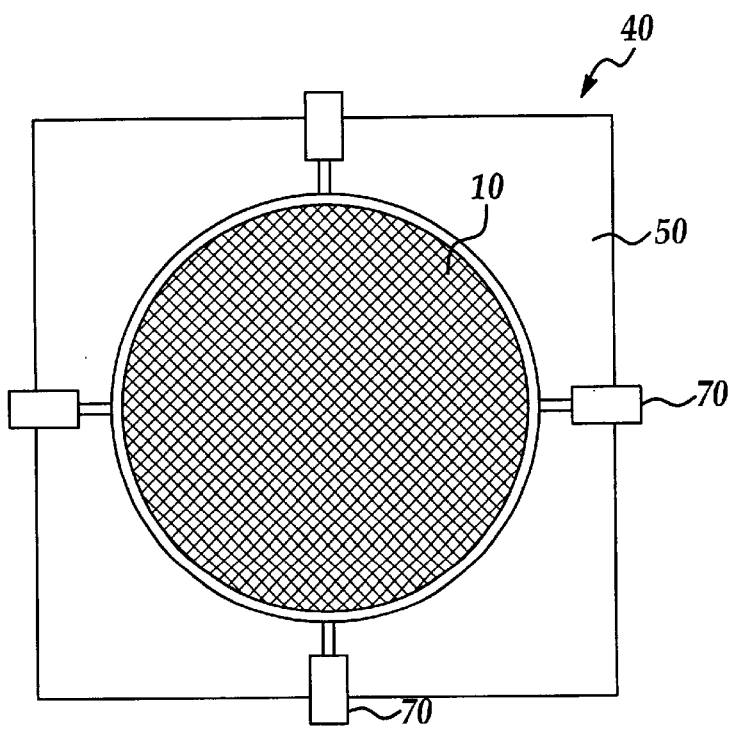
FIG. 5 is a plane view of a present invention apparatus for filling the via openings with a molten solder material.
Figure 6:
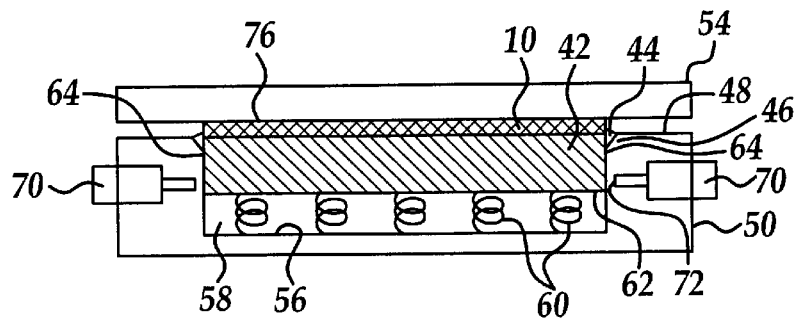
FIG. 6 is a cross-sectional view of the present invention apparatus of FIG. 5 with a reference flat plate positioned on top.
Figure 7:
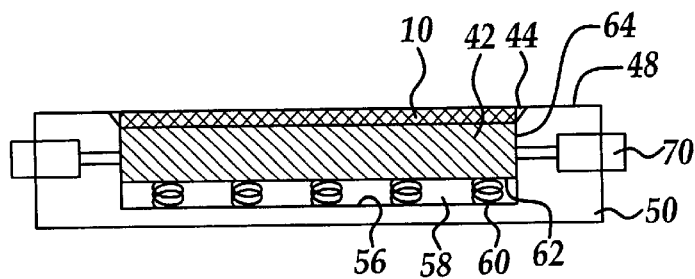
FIG. 7 is a cross-sectional view of the present invention apparatus of FIG. 6 with the silicon wafer mounted in the apparatus.

The method for filling the apertures with a molten solder screening technique is shown in FIGS. 5, 6 and 7. Another novel aspect of the present invention is the use of a fixture 40 which the wafer 10 is joined to for providing the required mechanical features for the molten solder screening process. As shown in FIG. 5, the planarizing and squaring-up fixture 40 assures that the molten solder screening (MSS) head does not hang over the edge of the silicon wafer at the start and the end of the scanning process. Since the solder slot in a MSS head is wide enough to cover the entire area of an eight inch or twelve inch wafer, run-on and run-off areas cause the solder to spill when the head overhangs the wafer edge.

To prevent the spilling of solder, fixture 40 in effect "squares-off" the round wafer 10. The mounting of the wafer 10 into the planarizing fixture 40 can be described as follows. First, the wafer 10 is placed on a circular-shaped spring base plate 42 which has a slightly larger diameter than the wafer 10. A high temperature putty ring 44 such as a partially cured silicon rubber, etc., is then placed in and around the outer edge gap 46. Since the top surface 18 of the silicon wafer 10 and the top surface 48 of the fixture frame 50 must be on exactly the same plane, a reference flat plate 54, or an alignment plate, is placed on top of the silicon wafer 10 and pushed down until it bottoms out against the top surface 48 of the fixture frame 50. A plurality of spring means 60 are positioned between a bottom surface 56 of the cavity 58 and a bottom surface 62 of the spring base plate 42 for pushing the spring base plate 42 outwardly away from the cavity 58.

After the reference flat plate 54 bottoms out on the fixture frame 50, four mechanical locking means 70 are activated which lock the spring base plate 42 into a planarized position. The mechanical locking means 70 may be suitable bolts that threadingly engage a threaded hole (not shown) in the fixture frame 50 with a tip 72 of the bolt 70 exerting a compressive force on an peripheral edge 64 on the spring base plate 42. The mechanical locking means 70 locks the spring base plate 42 such that the relative position between the plate 42 and the fixture frame 50 is fixed. The reference flat plate, or the alignment plate 54 which is used to assure planarity between the wafer polyimide top surface 76 and the top surface 48 of the fixture frame 50 can now be removed.

To assure absolute planarity, the putty ring 44 may be trimmed by running a razor edge along the gap between the wafer perimeter and the fixture frame 50. At this point, the wafer/fixture assembly 40 is ready for the molten solder screening process in which a molten solder dispensing head (not shown) scans and fills the entire wafer. The fixture frame 50 provides the run-on and run-off areas required to prevent the solder from spilling out.

The present invention novel method therefore utilizes a screen printable polyimide that has a CTE between that of silicon and solder which serves multiple functions of a passivation layer, a BLM mask, a solder mold and an underfill component. A MSS process is used for wafer solder bumping which eliminates the mold transfer step with the wafer, in effect, serving the function of a mold. The initial as-deposited solder preforms (or the flattened solder bumps) are coplanar with the rest of the wafer and thus assuring a mechanically robust solder joint at the intermediate stage which is impervious to handling and amenable to testing. The present invention novel method further utilizes a fixture that permits the MSS process to be carried out on a circular wafer by temporarily joining the wafer to a square fixture frame that is wide enough to accommodate the MSS head. The fixture frame which assures the top surface of the polyimide is absolutely coplanar with the top surface of the fixture frame through a spring loaded and lockable wafer base. The fixture frame further allows the elimination of any gap formed between the wafer edge and the fixture frame by filling the gap with a high temperature putty ring.

The present invention in-situ mold material 16 (FIG. 3) of a printable polyimide is designed and selected to serve several functions. First, the screen printable material is compatible in temperature resistance, in hardness, and in surface properties with the molten solder screening technique. Secondly, the screen printable polyimide in-situ mold material protects the solder bumps formed from damages during handling. Thirdly, the thermal fatigue enhancement of solder joints of the in-situ mold material is similar to standard underfill materials. In order to achieve solder joint thermal fatigue enhancement, an underfill material must adhere well to a silicon chip, to solder and substrate surfaces and has a thermal expansion coefficient close to that of solder.

Figure 8:
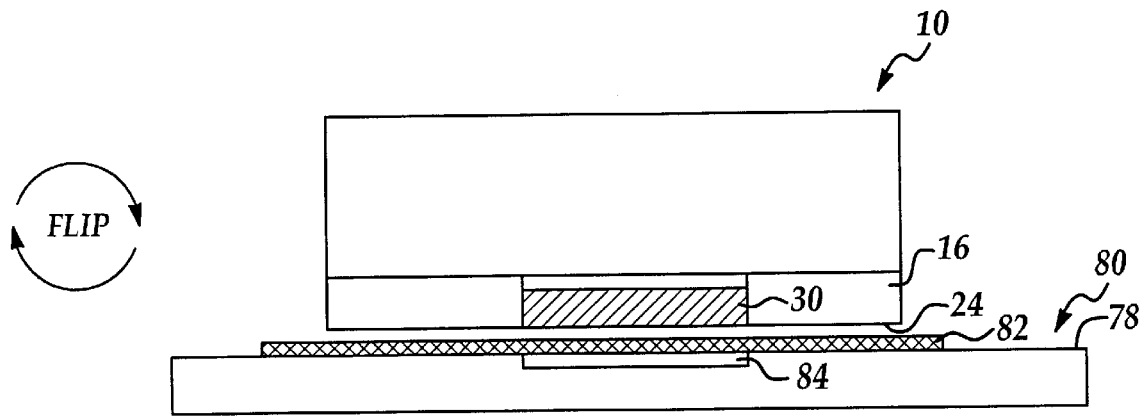
FIG. 8 is an enlarged, cross-sectional view illustrating the present invention method with the semiconductor chip flipped over such that the solder bump is lined up with the conductive pad on a circuit board with an underfill layer thereinbetween.
Figure 9:
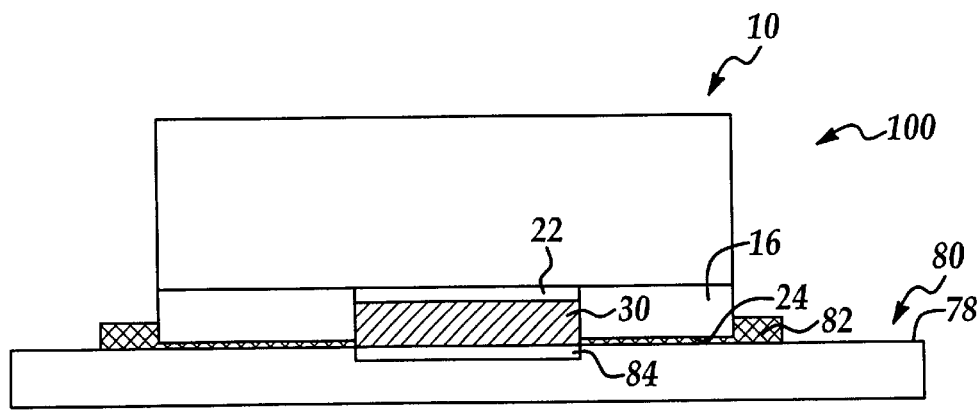
FIG. 9 is an enlarged, cross-sectional view of the present invention method shown in FIG. 8 after the solder bump, the underfill layer and the conductive pad are bonded together under heat.

The present invention joining process can be shown in FIGS. 8 and 9. In the joining process, a composite underfill concept is utilized which contains two materials, i.e., the in-situ mold material and the flux-containing underfill material. The in-situ mold material is deposited at chip level prior to bumping which can be processed to expose chip pads for subsequent bumping by the molten solder screening process. The in-situ mold material of polyimide has properties compatible with the MSS process, and further, has the suitable low CTE property and elastic modulus between that of chip and solder, such that the chip stress is minimized and the solder fatigue is enhanced. The in-situ polyimide mold material makes up the majority portion of the composite underfill thickness. The polyimide screen printable material can be screened onto wafers with properly defined and registered cavities corresponding to the locations of the bond pads.

In the process, the flux-containing underfill material is deposited on the substrate, or on the circuit board, prior to chip placement to a small thickness, i.e., less than 15 μm. The flux-containing underfill layer makes up a small portion of the composite underfill thickness. During curing of the underfill layer, the solder bump needs only to penetrate a thin layer of the underfill layer. After the curing process, the flux-containing underfill adheres to the in-situ polyimide mold and the substrate, i.e., the circuit board. Moreover, the effective CTE and elastic modulus of the composite underfill material, being proportional to the relative thickness of the two materials, are very close to that of the in-situ polyimide mold material, i.e., matched closely to solder.

FIG. 8 illustrates the joining process for the present invention semiconductor chip 10 to a circuit board, or substrate 80. It is seen that a thin underfill layer 82 is first disposed on a top surface 78 of the circuit board 80 prior to the joining process. The thin underfill layer contains a flux and has a thickness of less than 15 μm. The underfill layer 82 covers the bond pad, or the conductive pad 84 situated on the top surface 78 of the circuit board 80.

The semiconductor 10 with its pancake-shaped solder bump 30 exposed is then flipped over and positioned on top of the circuit board 80 with the solder bump 30 aligned to the conductive pad 84. This is shown in FIG. 8. After the semiconductor chip 10 and the circuit board 80 are pressed together, as shown in FIG. 9, a bond is formed between the top surface 24 of the polyimide in-situ mold layer 16 and the top surface 78 of the circuit board 80. During the bonding process, the temperature of the chip/substrate assembly 100 is heated to a temperature above the melting temperature of the solder 30. For instance, for a solder material that has an eutectic melting point of 183° C., the assembly 100 is normally heated to a reflow temperature between about 200° C. and 230° C. As the reflow temperature is reached, the fluxing agent in the underfill layer 82 activates the solder 30 in the mold opening and pulls it toward the metalized pad 84 on the substrate 80. The bond pad 84 has a large wetting diameter such that there is substantially no ball-up of the solder 30. During the reflow process, the solder 30 only protrudes enough to penetrate through the thin underfill layer 82 to wet the substrate pad 84. As a result, most of the solder 30 stays within the in-situ mold opening which in effect functions as the bulk of the underfill.

The present invention composite underfill is achieved when the reflow temperature is approached and the thin underfill layer 82 is activated to adhesively bond to the in-situ mold layer 16 on the chip 10 and to the circuit board 78. Through this bonding, the underfill layer 82 and the mold layer 16 become an integral part. Since the solder 30 stays within the mold opening, the solder mold 16 functions as a stress absorber between the CTE's of silicon 10 and the plastic laminate 80. To achieve its functionality along with being an in-situ mold, the in-situ polyimide mold layer 16 must have a CTE between that of solder and silicon. Since the bulk of the solder 30 is within the in-situ mold layer 16 even after the direct chip attach process, the in-situ mold layer becomes the major component of the composite underfill, with the pre-disposed thin underfill layer 82 that was applied to the circuit board 80 before the attach being the minor component, as far as thickness is concerned.

The present invention novel method therefore achieves several advantages over the conventional processes. First, the solder fatigue enhancing material can be deposited at wafer level, but still allow chip attach to a temporary carrier to burn-in and to be subsequently removed. This is possible due to the fact that the thin underfill material layer is only deposited on the ultimate, permanent carrier. Secondly, the solder fatigue enhancing material becomes an integral part of the wafer level solder bumping process, rather than a time consuming, one-chip-at-a-time step at chip assembly.

The present invention novel method provides a wafer that can be bumped using a low cost molten solder screening process and an in-situ polymeric mold material. The process involves scanning the wafer with an in-situ mold over an MSS head. A single scan fills all the cavities in the mold with molten solder which is then allowed to cool and solidify. The process allows a single step for all chip interconnects to be filled on the wafer surface. The in-situ polymeric mold material has properties of CTE and elastic modulus close to that of solder. The chips formed can then be diced and solder bumps are protected in subsequent handling by the in-situ mold material.

The present invention novel method attaches chips to a circuit board by first applying a very thin layer of flux-containing underfill on the circuit board and then passes attached assembly through a temperature cycle which simultaneously attaches chip solder bumps to substrate conductive pads and cures the thin layer of underfill material to provide adhesion between the layer of underfill and both the in-situ mold surface and the circuit board surface. In the method, the thickness of the in-situ mold material is much greater than that of the thin layer of underfill material, such that the composite underfill material has essentially the same thermal-mechanical properties (CTE, elastic modulus, etc.) as the in-situ mold material.

The present invention novel method provides chips that can be attached to a temporary substrate by placing onto substrate pads, passing through a temperature cycle to attach the chip solder bumps to the substrate conductive pads, but without any material between in-situ mold surface and substrate surface, so that there is no adhesion between the two. The assembly can then be burned-in and tested and then, if being electrically functional, be attached to a substrate by the present invention novel method of direct chip attach.

The present invention novel method has been amply described in the above descriptions and in the appended drawings of FIGS. 1~9. While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows:

What is claimed is:

1. An electronic assembly comprising:

a semiconductor chip having a top surface overlayed by a layer of insulating material containing a first multiplicity of via openings each filled with a solder bump on top of a bond pad, said layer of insulating material having a thickness between about 20 $\mu$m and about 200 $\mu$m, and a circuit board having a top surface formed with a second multiplicity of conductive pads positioned in a mirror image relationship to said first multiplicity of via openings on said semiconductor chip, said top surface of the circuit board intimately joins said top surface of the semiconductor chip with an underfill layer disposed thereinbetween such that electrical communication between said first multiplicity of via openings filled with said solder bumps and said corresponding second multiplicity of conductive pads is established.

2. An electronic assembly according to claim 1, wherein said layer of insulating material covering said top surface of the semiconductor chip being formed of a polymeric material.

3. An electronic assembly according to claim 1, wherein said layer of insulating material overlying said top surface of the semiconductor chip being a screen printable polyimide.

4. An electronic assembly according to claim 1, wherein said layer of insulating material overlying said top surface of the semiconductor chip being an in-situ mold for filling by a molten solder screening process of said first multiplicity of solder bumps.

5. An electronic assembly according to claim 1, wherein each of said multiplicity of via openings further comprises a BLM layer disposed between said solder bump and said bond pad.

6. An electronic assembly according to claim 5, wherein said BLM layer comprises at least two sublayers selected from the group consisting of an adhesion layer, a diffusion barrier layer and a wetting layer.

7. An electronic assembly according to claim 1, wherein said underfill layer further comprises a surface enhancing agent.

8. An electronic assembly according to claim 1, wherein said underfill layer disposed between said semiconductor chip and said circuit board has a thickness of not more than 15 $\mu$m.

* * * * *